United States Patent
Pfannenmueller et al.

Patent Number: 5,448,644
Date of Patent: Sep. 5, 1995

[54] HEARING AID

[75] Inventors: Gerhard Pfannenmueller, Oberasbach; Raimund Martin, Eggolsheim, both of Germany

[73] Assignee: Siemens Audiologische Technik GmbH, Erlangen, Germany

[21] Appl. No.: 54,201

[22] Filed: Apr. 30, 1993

[30] Foreign Application Priority Data

Jun. 29, 1992 [DE] Germany .............. 42 21 303.7

[51] Int. Cl.6 .................................. H04R 25/00
[52] U.S. Cl. ............................ 381/68; 381/68.2
[58] Field of Search ............... 381/68.2, 68, 68.4, 381/117; 330/10, 207 A, 251; 341/110, 152; 331/143, 111, 74

[56] References Cited

U.S. PATENT DOCUMENTS

| 4,187,413 | 2/1980 | Moser | 381/68 |
| 4,187,466 | 2/1980 | Kasson et al. | 341/110 |
| 4,360,707 | 11/1982 | Joseph et al. | 330/10 |
| 4,524,334 | 6/1985 | Brajder et al. | 331/143 |
| 4,592,087 | 5/1986 | Killion | 381/68 |
| 4,689,819 | 8/1987 | Killion | 381/68 |

FOREIGN PATENT DOCUMENTS

2716336 7/1978 Germany .
3616752 1/1988 Germany .

OTHER PUBLICATIONS

Article from the book: Halbleiterschaltungstechnik, 6th edition, Tietze & Schenk, Springer–Verlag, Berlin, 1983, p. 462.

Primary Examiner—Curtis Kuntz
Assistant Examiner—Huyen D. Le
Attorney, Agent, or Firm—Hill, Steadman & Simpson

[57] ABSTRACT

In a hearing aid having an input transducer (2), a useful signal processor (4 through 9) having an output stage (9), and an output transducer (11), whereby a first time-discrete useful signal processing is provided preceding the output stage (9), and controlled by a sampling signal, a second time-discrete useful signal processing different therefrom is simultaneously employed without disturbing influences. To that end, a second time-discrete useful signal processing with a pulse-duration modulation is provided in the output stage (9), this being formed by a delta signal, whereby the sampling signal and the delta signal are derived from only one oscillator (12).

11 Claims, 1 Drawing Sheet

HEARING AID

BACKGROUND OF THE INVENTION

The present invention is directed to a hearing aid having an input transducer, a useful signal processing means having an output stage, and an output transducer, whereby the time-discrete useful signal processing that is controlled by a sampling signal precedes the output stage.

U.S. Pat. No. 4,187,413 discloses a hearing aid of the type initially cited. An analog-to-digital converter and a digital-to-analog converter are arranged preceding an output stage and following an input transducer (microphone). Further, a sampling frequency is provided for the time-discrete signal processing. The sampling frequency is selected to be no lower than twice the upper limit frequency of the useful signals to be processed.

U.S. Pat. Nos. 4,689,819 and 4,592,087 disclose a hearing aid wherein time-discrete useful signal processing with a pulse duration modulation is provided in the output stage, this pulse duration modulation being formed by means of a delta signal. The delta signal is acquired via an integrator that is driven by a square-wave signal from a square-wave generator. The frequency of the square-wave signal and, thus, the frequency of the delta signal as well lie in the ultrasound frequency range. As long as the oscillator frequency is at least twice the frequency of the highest audio frequency component, the resulting frequency spectrum has an audio frequency part that represents an image of the voltage that is generated by a microphone, as well as ultrasound frequency components that are derived from the switch effect that is induced by an oscillator. The output stage is fashioned as a switching amplifier.

The book, *Halbleiterschaltungstechnik*, 6th Edition, Tietze and Schenk, Springer-Verlag, Berlin, 1983, page 462, discloses an oscillator that is fashioned as a delta voltage generator, whereby the delta signal thereof can be compared to upper and lower threshold voltages in a Schmitt trigger allocated to the oscillator. When the delta signal coincides with one of the threshold voltages, the Schmitt trigger outputs a signal to an analog switch. The oscillator has an integrator whose integration direction is reversible dependent on an input signal supplied via the analog switch. The integrator has its output side in an interactive connection with the Schmitt trigger, whereby the Schmitt trigger controls the analog switch with which the input signal for reversing the integration direction at its integrator output can be supplied to the integrator.

It has been perceived that, first, a combination of various, time-discrete useful signal processing methods in only one hearing aid can be advantageous and that, second, the required outlay for generating the various auxiliary signals (for example, sampling signal and delta signal) is relatively high and leads to space problems in the relatively small hearing aid.

It has also been found that the two auxiliary signals that are required at a minimum can produce disturbing influences in the two different, time-discrete useful signal processing methods. In particular, additional frequencies arise due to the auxiliary signals on the basis of intermodulation and these additional frequencies can fall into the frequency range of the useful signals to be processed either directly or by mixing. A mutual shielding and/or decoupling, for example by filters, of the relevant components for the various, time-discrete useful signal processing methods would thus noticeably increase the circuit-oriented outlay as well as the space requirement in the hearing aid once again. Insofar as such hearing aides are realized, the disadvantages thus arising must be accepted.

SUMMARY OF THE INVENTION

It is an object of the present invention to provide a hearing aid of the type initially cited such that two different, time-discrete useful signal processing methods can be advantageously and simultaneously employed without creating disturbing influences in the hearing aid.

This object is achieved by a hearing aid having an input transducer, a useful signal processing means with an output stage, and an output transducer. A first time-discrete useful signal processing that is controlled by a sampling signal is provided preceding the output stage. A second time-discrete useful signal processing with a pulse-duration modulation is provided in the output stage, this being formed by a delta signal. A fixed relationship is provided between the sampling signal and the delta signal with respect to their frequencies and the frequencies are derived from only one oscillator.

Advantageous developments of the present invention are as follows. The oscillator is fashioned as a delta voltage generator whose delta signal can be compared to upper and lower threshold voltages in a comparison circuit allocated to the oscillator. The comparison circuit outputs a signal to a sampling signal forming unit when there is a coincidence of the delta signal with one of the threshold voltages.

The oscillator has an integrator whose integration direction is reversible dependent on an input signal, whose input is in interactive connection with a switch means and whose output is in interactive connection with the comparison circuit. The comparison circuit controls the switch means with which the input signal for reversing the integration direction at its integrator output can be supplied to the integrator. The delta signal can be taken at the integrator output and the sampling signal can be taken at an output of the switch means.

The sampling signal and the delta signal have a frequency that corresponds to the frequency generated by the oscillator. Alternatively, the sampling signal or the delta signal has a frequency that is a multiple of the frequency generated by the oscillator and that can be taken from a frequency multiplier allocated to the oscillator. Also, the frequency of the oscillator can be selected such that, in combination with a multiple frequency of the sampling signal or of the delta signal derived therefrom, no mixed products arise that fall into the transmission range of the useful signals. A critical advantage of the present invention is that the sampling signal for the first time-discrete useful signal processing, for example with pulse code modulation, and the delta signal for the second time-discrete useful signal processing with a pulse duration modulation are derived from only one oscillator. The intermodulation products that would arise due to the simultaneous employment of separate oscillators for the sampling signal and for the delta signal are thus eliminated.

Despite the combination of means for the employment of two different time-discrete useful signal processing methods in only one hearing aid, the space requirement is reduced due to the elimination of an oscillator. Moreover, mutual shieldings, particularly between the auxiliary signals, can be foregone since both the sampling signal and the delta signal are derived from the same oscillator.

A fixed coupling or relationship between the two auxiliary signals is present, particularly with respect to the frequency, as a result whereof synchronization problems cannot arise. As a result of this fixed relationship, the two auxiliary signals operate synchronously even when one of the auxiliary signals has been multiplied in a development of the present invention. When the fundamental frequency and the multiplied frequency are selected such that their mix products do not fall into the transmission range of the useful signals, no synchronization problems that could in turn again lead to disturbing influences occur because of the fixed relationship between these two frequencies. Given the employment of separate oscillators for the two mutually different, time-discrete useful signal processing methods, each oscillator would have to have high frequency consistency and/or be synchronized with the other in order to avoid the creation of additional mixed products as a result of the frequencies generated by the two oscillators drifting apart.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
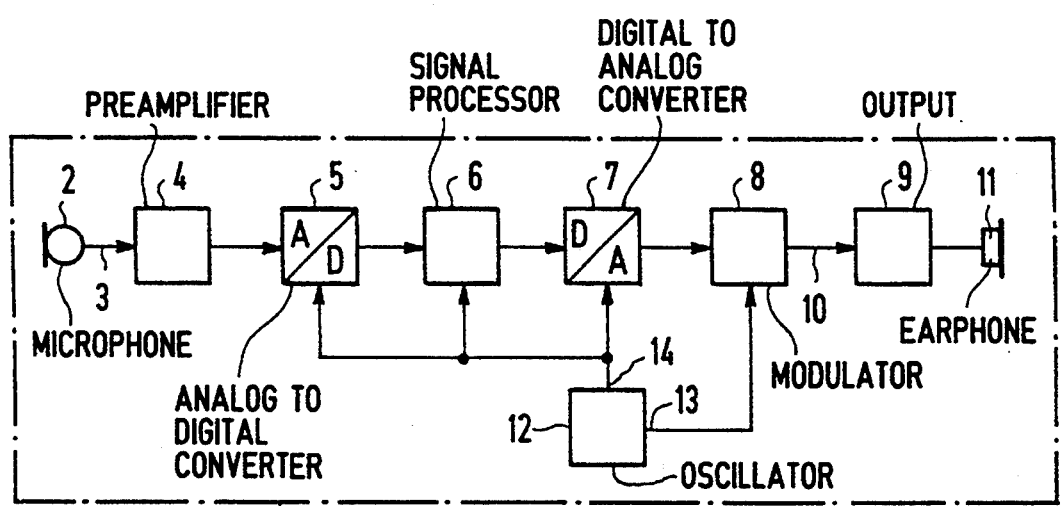
FIG. 1 is a block diagram of a hearing aid for two different, time-discrete useful signal processing methods whose components are supplied with different auxiliary signals by a common oscillator.

A hearing aid 1 is symbolically illustrated by a dot-dash line in FIG. 1. The hearing aid 1 has a microphone 2 as input transducer whose electrical useful signals are supplied via a line 3 to a useful signal processing means. The useful signal processing means in this exemplary embodiment has a pre-amplifier 4, an analog-to-digital converter 5, a first time-discrete useful signal processing unit 6, a digital-to-analog converter 7, a modulator 8 for generating a pulse-duration-modulated signal, and an output stage 9. The output stage 9 is fashioned as a switching amplifier that is driven by the pulse-duration-modulated signal via a line 10. The output stage 9 fashioned as a switching amplifier thus represents a circuit for a second time-discrete signal processing that is different from the time-discrete signal processing in the useful signal processing unit 6. The output stage 9 is connected to an electrical earphone 11 as output transducer.

Inventively, the hearing aid 1 has only one oscillator 12 that outputs a delta signal via its output 13 to the modulator 8 and outputs a sampling signal via its output 14 to the analog-to-digital converter 5, to the first time-discrete signal processing unit 6 and to the digital-to-analog converter 7.

Figure 2:
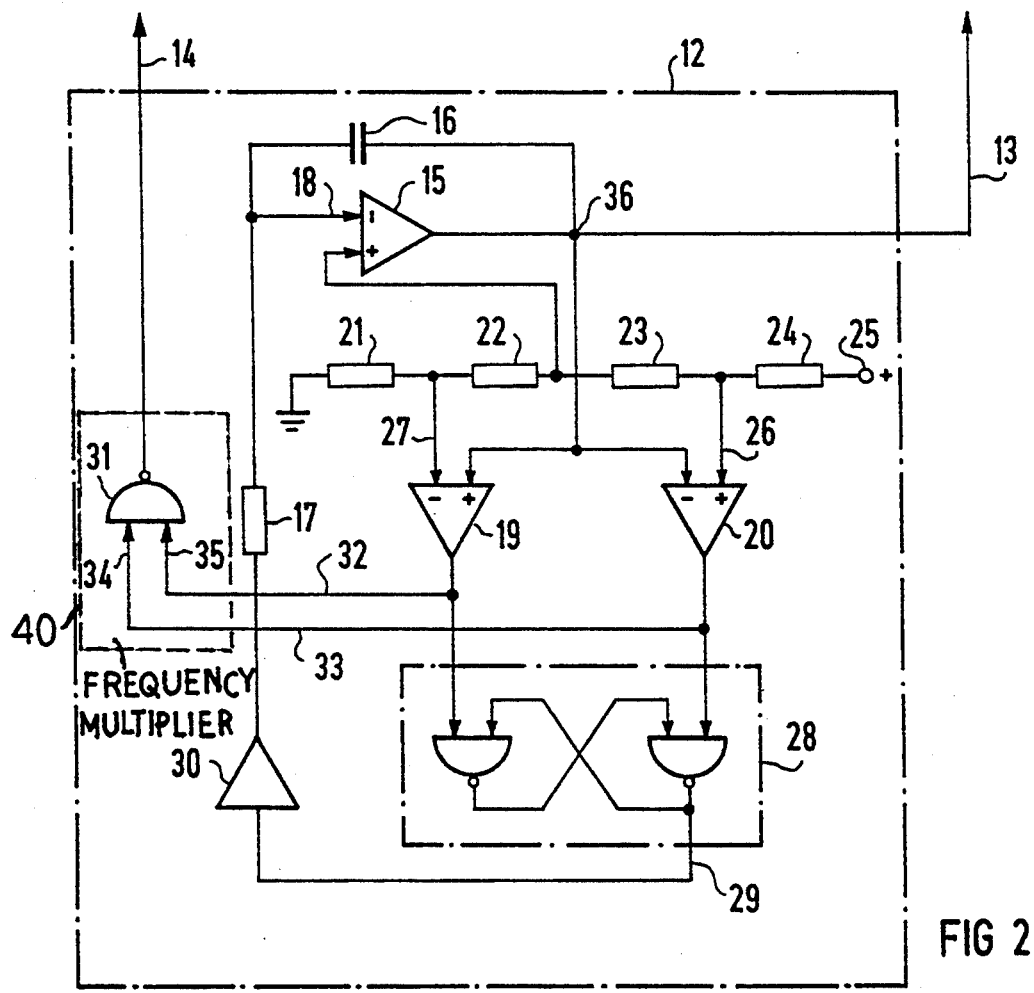
FIG. 2 a more detailed block diagram of an oscillator according to the hearing aid of FIG. 1.

The oscillator 12 contained in FIG. 1 is shown in FIG. 2 as a specific oscillator 12 having the outputs 13 and 14. The specific oscillator 12 contains an integrator as its frequency-defining element, this integrator consists of an operational amplifier 15 with a capacitor 16 and a resistor 17. The time constant of the integrator is defined by the capacitor 16 and by the resistor 17. The operational amplifier 15 has feedback due to the capacitor 16 connected between its input 18 and its output 36. A delta signal is available at the output 36 of the operational amplifier 15 as a result of the affect of the integrator. The delta signal is supplied, first, to the output 13 of the oscillator 12 and, second, to a comparison circuit having two comparators 19 and 20.

The oscillator 12 has a series circuit of, for example, four resistors 21 through 24. The series circuit of these resistors 21 through 24 forms a voltage divider that can be connected via a terminal 25 to an operating voltage source, for example to the positive terminal of a hearing aid battery (not shown). The voltage divider supplies a high threshold voltage via a line 26 and supplies a low threshold voltage via the line 27 to the comparison circuit formed by the two comparators 19 and 20. The delta signal supplied to this comparison circuit can fluctuate in amplitude (peak value) between the threshold voltages on the two lines 26 and 27. When the amplitude of the delta signal reaches one of the threshold voltages, one of the comparators 19 or 20 outputs an output signal to a bistable flip-flop 28 acting as a switch means. As a result thereof, the level at an output 29 of the bistable flip-flop 28 changes from, for example, a high value to a low value or vice versa. The input 18 of the operational amplifier 15 is connected to the output 29 of the bistable flip-flop 18 via a driver 30 and via the resistor 17.

As a result of the switching of the output level at the flip-flop 28, the level at the input 18 of the operational amplifier 15 also consequently changes. This level change effects a reversal of the integration direction of the integrator. As soon as a coincidence with one of the threshold voltages on the lines 26 or 27 (as well as exceeding the respective threshold voltage) is again achieved due to the reversed integration, another switch-over of the bistable flip-flop 28 occurs in response to a signal from one of the two comparators 19 or 20. As a result, the integration direction of the integrator is again reversed. The arrangement consequently oscillates and thus forms an oscillator. The oscillator frequency is dependent on the time constant of the integrator 10 and is also additionally influenced by the selection of the threshold voltages on the lines 26 and 27.

The bistable flip-flop 28 supplies an output signal that can also be used as a sampling signal. Consequently, the bistable flip-flop 28 of the oscillator 12 also forms a sampling signal forming stage.

In one version of the present invention, the sampling signal that can be taken via the output 14 of the oscillator 12 can also be formed with a not-AND circuit (NAND element) 31. The not-AND circuit 31 is consequently fashioned as a sampling signal forming unit. To that end, the comparators 19 and 20 have their outputs connected to two inputs 34 and 35 at the sampling signal forming unit 31 (NAND element) via lines 32 and 33. Due to the fashioning of the sampling signal forming stage as a NAND element 31, a frequency doubling of the sampling signal in comparison to the delta signal results. The NAND element 31 thus also acts as a frequency multiplier 40.

The fundamental frequency of the oscillator 12 is selected such that no mixed products arise in combination with the doubled frequency of the sampling signal or of the delta signal that can be taken from the NAND element 31. These mixed products are those that would be in the transmission range of the useful signals that are picked up by the input transducer 2 and/or output by the output transducer 11.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A hearing aid, comprising: input transducer;
signal processing system connected to said input transducer and having an output stage;
output transducer connected to said output stage; and
a single oscillator that outputs a sampling signal and a delta signal, frequencies of said sampling signal and said delta signal having a fixed relationship, said single oscillator connected to said signal processing system such that a first time-discrete signal processing that is controlled by the sampling signal is provided preceding said output stage, and such that a second time-discrete signal processing with a pulse-duration modulation that is formed by the delta signal is provided in said output stage.

2. The hearing aid according to claim 1, wherein the oscillator comprises a delta voltage generator that outputs said delta signal, a comparison circuit and a sampling signal forming unit that outputs said sampling signal, wherein said delta signal that is output by said delta voltage generator is compared to upper and lower threshold voltages in said comparison circuit, and wherein the comparison circuit outputs a signal to said sampling signal forming unit when there is a coincidence of said delta signal with one of the upper and lower threshold voltages.

3. The hearing aid according to claim 1, wherein the oscillator comprises an integrator having an integration direction that is reversible dependent on an input signal thereto, having an input interactively connected to a switch element and having an output interactively connected to a comparison circuit, wherein said comparison circuit controls said switch element, by means of which the input signal for reversing the integration direction at an integrator output of the integrator is supplied to the integrator.

4. The hearing aid according to claim 3, wherein said delta signal is taken at said integrator output and said sampling signal is taken at an output of said switch element.

5. The hearing aid according to claim 1, wherein said sampling signal and said delta signal each have a frequency that corresponds to a frequency generated by said oscillator.

6. The hearing aid according to claim 1, wherein said oscillator further comprises a frequency multiplier, and wherein one of said sampling signal and said delta signal has a frequency that is a multiple of a frequency generated by said oscillator and that is taken from said frequency multiplier.

7. The hearing aid according to claim 6, wherein a frequency of said oscillator is selected such that, in combination with a multiple frequency of said one of said sampling signal and said delta signal, no mixed products arise that fall into a transmission range of signals that are processed in the hearing aid.

8. A hearing aid having an input transducer and an output transducer, comprising:
a signal processing system connected to said input transducer and to said output transducer and utilizing a sampling signal and a delta signal for processing signals from said input transducer;
a single oscillator for supplying said sampling signal and said delta signal to said signal processing system, said sampling signal having a frequency that has a fixed relationship to a frequency of said delta signal;
said single oscillator having an integrator having an integrator input and having an integrator output that provides said delta signal;
said single oscillator having an comparator circuit having a first comparator input connected to said integrator output, having second and third comparator inputs, and having first and second comparator outputs;
said single oscillator having a threshold circuit that supplies a predetermined low threshold level to said second comparator input and a predetermined high threshold level to said third comparator input, said comparator circuit comparing said delta signal to said low and high threshold levels and outputting a signal on said first comparator output when said delta signal is equal to or less than said low threshold level, and outputting a signal on said second comparator output when said delta signal is equal to or greater than said high threshold level;
said single oscillator having a switch element having first and second elements connected to said first and second comparator outputs, respectively, and having an output operatively connected to said integrator input; and
said single oscillator having a sampling signal forming unit having first and second inputs connected to said first and second comparators outputs, respectively, and having an output that provides said sampling signal.

9. The hearing aid according to claim 8, wherein said sampling signal forming unit is a NAND element.

10. The hearing aid according to claim 9, wherein said NAND element is a frequency multiplier, and wherein said sampling signal has a frequency that is a multiple of a frequency generated by said oscillator.

11. The hearing aid according to claim 10, wherein a frequency of said oscillator is selected such that, in combination with a multiple frequency of said sampling signal, no mixed products arise that fall into a transmission range of signals that are processed in the hearing aid.

* * * * *